(12) United States Patent
Du

(10) Patent No.: US 11,604,169 B2
(45) Date of Patent: Mar. 14, 2023

(54) RENEWABLE POWER SYSTEM AND METHOD FOR PIPELINE INSPECTION TOOLS

(71) Applicant: Shuyong Paul Du, Plano, TX (US)

(72) Inventor: Shuyong Paul Du, Plano, TX (US)

(*) Notice: Subject to any disclaimer, the term of this patent is extended or adjusted under 35 U.S.C. 154(b) by 548 days.

(21) Appl. No.: 16/739,459

(22) Filed: Jan. 10, 2020

(65) Prior Publication Data
US 2020/0225193 A1 Jul. 16, 2020

Related U.S. Application Data

(60) Provisional application No. 62/925,861, filed on Oct. 25, 2019, provisional application No. 62/790,971, filed on Jan. 10, 2019.

(30) Foreign Application Priority Data

Dec. 19, 2019 (CN) .......................... 201911314967.6
Dec. 19, 2019 (CN) .......................... 201922291672.3

(51) Int. Cl.
*G01N 29/07* (2006.01)
*F17D 5/06* (2006.01)
(Continued)

(52) U.S. Cl.
CPC ............. *G01N 29/07* (2013.01); *E21B 47/26* (2020.05); *F16L 55/48* (2013.01); *F17D 5/06* (2013.01);
(Continued)

(58) Field of Classification Search
CPC .......... G01N 29/07; G01N 2291/02872; E21B 47/26; F16L 55/48; F16L 55/32; F16L 2101/30; F17D 5/06; H01L 35/02
(Continued)

(56) References Cited

U.S. PATENT DOCUMENTS 4,945,775 A 8/1990 Adams et al.
5,625,245 A 4/1997 Bass
(Continued)

FOREIGN PATENT DOCUMENTS

CN 102563958 A 7/2012
CN 104335371 * 2/2015
WO WO-2018145181 A1 * 8/2018 .............. F02B 63/04

OTHER PUBLICATIONS

Mumtaz et al. "Thermal Analysis of Oil Pipeline Coatings." rimson Publishers, Wings to the Research. Research and Development in Material Science (ISSN:2576-8840) (Oct. 17, 2017).
(Continued)

*Primary Examiner* — Jacques M Saint Surin
(74) *Attorney, Agent, or Firm* — Loza & Loza, LLP; Jessica W. Smith

(57) ABSTRACT

A device for use within pipelines, such as an inline inspection tool, includes a renewable power system. The renewable power system includes at least one of a thermoelectric generator or a pressure-based power generator. The thermoelectric generator produces electricity by consuming thermal energy from the heat of the product in the pipeline such as oil or gas. The pressure-based power generator operates by using a rotary connection axis for a turbine which drives an alternator to generate electrical energy. The device may combine both type of generators with a unified power system including regulators, high density batteries, battery chargers, cooling system.

20 Claims, 17 Drawing Sheets

(51) Int. Cl.
*F16L 55/48* (2006.01)
*H10N 10/80* (2023.01)
*E21B 47/26* (2012.01)
*H01L 35/02* (2006.01)

(52) U.S. Cl.
CPC .... *H01L 35/02* (2013.01); *G01N 2291/02872* (2013.01)

(58) Field of Classification Search
USPC .......................................................... 73/592
See application file for complete search history.

(56) References Cited

U.S. PATENT DOCUMENTS

| | | | |
|---|---|---|---|
| 5,892,656 A | 4/1999 | Bass | |
| 6,304,002 B1* | 10/2001 | Dehlsen | F03D 15/00 310/75 R |
| 6,410,971 B1* | 6/2002 | Otey | H01L 35/32 438/54 |
| 7,574,856 B2* | 8/2009 | Mak | F01K 23/10 60/645 |
| 8,143,732 B2* | 3/2012 | Algrain | F02B 37/10 290/1 A |
| 8,692,408 B2* | 4/2014 | Zhang | H02M 7/003 307/151 |
| 8,857,170 B2* | 10/2014 | Oxner | F01C 20/26 60/398 |
| 8,890,351 B2* | 11/2014 | Bats | H02J 3/381 290/52 |
| 9,103,193 B2* | 8/2015 | Coli | F04B 17/03 |
| 9,338,896 B2* | 5/2016 | Owei | B05D 5/10 |
| 9,803,803 B1* | 10/2017 | Adams | F17C 1/007 |
| 2004/0217759 A1 | 11/2004 | Burkhardt et al. | |

OTHER PUBLICATIONS

Liu. "Oil and gas pipeline transportation process." (ISBN 978-7-5114-4245-1) (2016).

Yu et al. "Thermal analysis of recent crude oil transportation technologies in China." 6th Intl Advanced Technologies Symposium (IATS'11), Elazığ, Turkey (May 16-18, 2011).

Zhao et al. "Natural Gas Transmission Pipeline Temperature Drop Calculation. Advances in Petroleum Exploration and Development." CSCanada, Advances in Petroleum Exploration and Development, vol. 7:2, pp. 127-131 (2014).

Zhang et al. "Thermoelectric materials: Energy conversion between heat and electricity." J. Materiomics 1, 92-105 (2015).

Leblanc. "Thermoelectric generators: Linking material properties and systems engineering for waste heat recovery applications." Sustainable Materials and Technologies 1-2, 26-35 (2014).

* cited by examiner

RENEWABLE POWER SYSTEM AND METHOD FOR PIPELINE INSPECTION TOOLS

CROSS REFERENCE TO RELATED APPLICATIONS

The present application claims priority under 35 U.S.C. § 119 to U.S. Provisional Application No. 62/790,971 entitled, "RECHARGEABLE POWER SYSTEM AND METHOD FOR PIPELINE INSPECTION TOOLS," filed Jan. 10, 2019, which is hereby expressly incorporated by reference herein.

The present application claims priority under 35 U.S.C. § 119 to U.S. Provisional Application No. 62/925,861 entitled, "PRESSURE-BASED POWER GENERATION SYSTEM AND METHOD FOR PIPELINE INSPECTION TOOLS," filed Oct. 25, 2019, which is hereby expressly incorporated by reference herein.

The present application claims priority under 35 U.S.C. § 119(a) to Chinese Utility Model Application No. 201922291672.3 entitled, "RENEWABLE POWER SYSTEM AND METHOD FOR PIPELINE INSPECTION TOOLS," filed Dec. 19, 2019, and hereby expressly incorporated by reference herein.

The present application claims priority under 35 U.S.C. § 119(a) to Chinese Application No. 201911314967.6 entitled, "RENEWABLE POWER SYSTEM AND METHOD FOR PIPELINE INSPECTION TOOLS," filed Dec. 19, 2019, and hereby expressly incorporated by reference herein.

FIELD

This application relates to an inline inspection tool for monitoring pipelines and a power generation system and method for the inline inspection tool.

BACKGROUND

Long distance pipelines transport products between cities, countries and even continents. Pipeline networks are widespread, running alternately through remote and densely populated regions. Nearly three million miles of pipeline transporting natural gas, oil, refined products and other hazardous liquids crisscross the United States. Pipelines transport nearly two-thirds of the country's energy supply and may convey flammable or explosive materials. Therefore, improving pipelines' safety and security is so critical for not only securing "the Veins of the American Economy" but also eliminating any potential chance of public injury, destruction of property, and environmental damage.

Inline inspection of terrestrial pipelines or deep water pipelines is complicated. Inspections can be lengthy and costly. When investigating potential defects, it is very hard and challenging to collect the high-quality inspection data required to make accurate assessments. The common methods of inspection, which can be costly and time-consuming, often fail to generate the high-resolution data necessary for proper assessment of the pipeline.

Sophisticated and sensitive inline inspection (ILI) tools travel through the pipe and measure and record irregularities that may represent corrosion, cracks, laminations, deformations (dents, gouges, etc.), or other defects. Because they run inside the pipe in a manner similar to the scrubbing and scraping devices known as "pigs", these inline inspection tools are often referred to as "smart pigs".

Currently, the different types of inline inspection tools are propelled by the pressure of the product in the pipeline itself. For example, U.S. Pat. No. 4,945,775 filed on Jun. 7, 1989 entitled "Inertial based pipeline monitoring system" states that: "A pipeline monitoring system as defined, . . . including an onboard power generator mounted within said carrier means, said generator comprising means for bypassing fluid flow within said pipeline to within said carrier means, a turbine within said carrier means for receiving said fluid flow and in response driving an alternator connected to said turbine, said alternator being adapted to generate DC power in response to being driven via said turbine." The U.S. Pat. No. 4,945,775 describes an onboard power generator mounted on the inspection tool. However, it is used for powering the measurement systems, and it is not used for driving the tool's movement inside the pipeline. Current pipeline inspection tools in the world including the one in the U.S. Pat. No. 4,945,775 is still an "Inertial based pipeline monitoring system".

For pipelines buried underground in a horizontal direction, there is not as much pressure loss for unchanging elevation. However, considering a vertical submarine pipeline or ramp up pipeline across mountainous areas where the fluid is flowing upwards, gaining elevation height as it goes, the pressure may decrease significantly and the inline inspection tool's weight may transform into resistance. Therefore, an inertial based pipeline monitoring system may not be able to move upwards successfully. Also, the low operating pressure and the design of the system may prevent inline inspection tools' effective use in gas distribution lines.

Pipeline obstacles such as dented pipes or obstructions and deformations may also prevent inline inspection tools from traversing the entire length of a pipeline. Geometric constraints such as pipe curvature or valves may also prevent conventional inline inspection tools from passing through sections of the pipeline. Accordingly, the inline inspection tools may not be able to collect data concerning this particular section of pipeline. As a result, the pipeline operators may get an incomplete picture of the status of the pipeline. These blind spots may potentially contain flaws or defects in the pipeline and similar conditions that otherwise require maintenance or attention to ensure safe and efficient operation of the pipeline.

U.S. Provisional Patent Application No. 62/816,008 filed on Mar. 8, 2019 entitled "Self-Adaptive System Structure and Method for An Inline Inspection Vehicle of Pipelines" which is hereby incorporated by reference herein, describes an inline inspection vehicle with auto-adjustable and self-adaptive structure, self-propelled feature, and renewable power system.

Therefore, it is a desire to provide an inline inspection tool with intelligent self-adaptive, auto-adjustable and self-propelled features powered by renewable power systems so that the inline inspection tool can traverse through obstacles and geometric constraints and collect data for substantially the entire pipeline.

SUMMARY

According to a first aspect, a renewable power system for an inline device in a pipeline includes at least one of: a thermoelectric generator configured to convert thermal energy generated by a transmission medium in the pipeline to electricity or a pressure generator configured to convert pressure energy generated by the transmission medium in the pipeline to electricity. An auxiliary system is configured to receive a power supply from at least one of the thermoelectric generator or the pressure generator.

According to another aspect, s renewable power system for an inline device in a pipeline includes a thermoelectric generator configured to convert thermal energy generated by a transmission medium in the pipeline to electricity and a pressure generator configured to convert pressure energy generated by the transmission medium in the pipeline to electricity. An auxiliary system may then receive a power supply from one or both of the thermoelectric generator and the pressure generator.

In one or more of the above aspects, the thermoelectric generator includes a hot surface and a cold surface; one or more heat transfer support structures for transferring the thermal energy generated by the transmission medium in the pipeline to the hot surface; and a plurality of thermoelectric modules between the hot surface and the cold surface, wherein the plurality of thermoelectric modules generate electricity using a thermal gradient formed between the hot surface and the cold surface.

In one or more of the above aspects, the pressure generator includes a turbine configured to rotate in response to flow of the transmission medium and generate mechanical energy; an alternator for generating electrical energy from the mechanical energy; and a connection axis connecting the turbine and the alternator.

In one or more of the above aspects, the turbine includes a plurality of uniformly distributed blades having curved surfaces; an enclosure for the turbine; a plurality of inlets on a first side of the enclosure; and a plurality of outlets on an opposite side of the enclosure, wherein openings of the plurality of outlets is greater than openings of the plurality of inlets.

In one or more of the above aspects, a cross section of each of the plurality of inlets has a trapezoidal shape, and wherein a relatively large side of each of the plurality of inlets is located outside the enclosure and a relatively smaller side of each of the plurality of inlets is located inside the chassis.

In one or more of the above aspects, a cross section of the plurality of outlets has a sector shape.

In one or more of the above aspects, the pressure generator includes an insulated housing for retaining heat generated by the alternator; and a fan for transferring the heat to the thermoelectric module.

In one or more of the above aspects, the pressure generator includes an insulated housing for retaining heat generated by the alternator; and at least one thermoelectric module for converting the heat into electrical energy.

In one or more of the above aspects, the auxiliary system includes at least one voltage regulator for receiving at least one of alternating current or direct current from at least one of the thermoelectric generator or the pressure generator; at least one charger connected to the at least one at least one voltage regulator; at least one battery component connected to the at least one charger; and a cooling system for providing cooling for at least one of the thermoelectric generator or the pressure generator, and providing cooling for the at least one battery component.

In one or more of the above aspects, the cooling system includes a core storage compartment that stores a coolant; a first cool trunk for providing cooling to the thermoelectric generator; and a second cool trunk for providing cooling to the at least one battery component.

In one or more of the above aspects, the cooling system further includes a plurality of thermal sensors for obtaining temperatures at multiple locations within the renewable power system; and one or more thermal controllers configured to adjust the temperatures of the multiple locations within the renewable power system using the obtained temperatures.

In one or more of the above aspects, the one or more thermal controllers include at least one thermal controller disposed in the first cool trunk and configured to control an amount of the coolant in the first cool trunk and at least another thermal controller disposed in the second cool trunk and configured to control an amount of the coolant in the second cool trunk.

In one or more of the above aspects, a thermal controller is disposed in the first cool trunk configured to control a temperature of a cold surface of the thermoelectric generator.

In one or more of the above aspects, the cooling system further includes a cooling coil for providing cooling to an alternator, wherein the cooling coil is located in a hollow tunnel formed on a connection axis of the alternator.

In one or more of the above aspects, a connection axis forms a plurality of cooling holes positioned in a radial direction from the hollow tunnel, wherein the hollow tunnel connects with a sealed cooling box through the cooling holes, wherein the sealed cooling box is connected to the cooling coil.

In one or more of the above aspects, the plurality of thermoelectric modules are connected in series at a cold surface, and wherein each of the plurality of thermoelectric modules includes a P-type semiconductor and n-type semiconductor.

In one or more of the above aspects, the one or more heat transfer support structures include hole-like structural components.

DETAILED DESCRIPTION

Figure 1A:
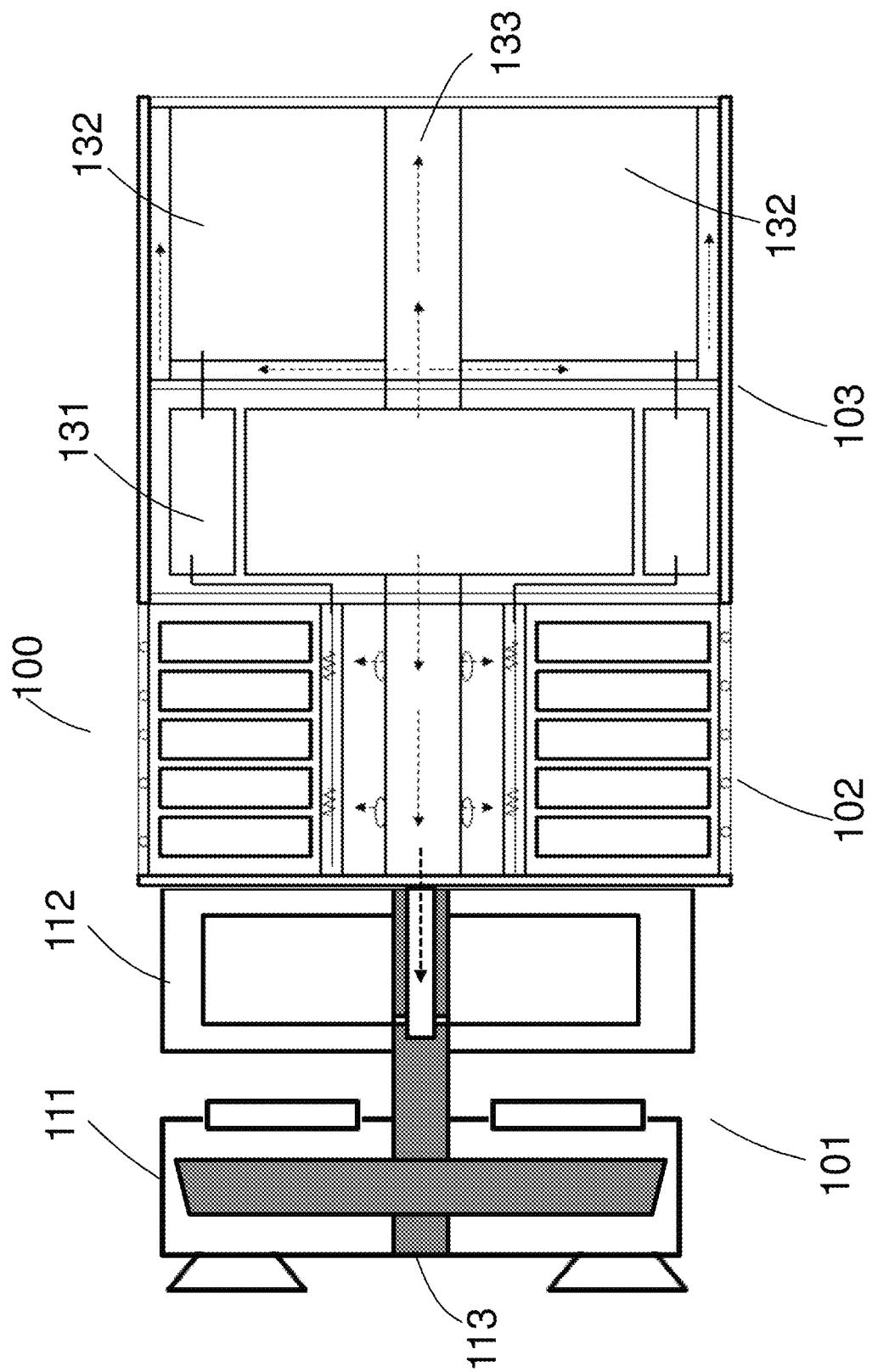
FIG. 1A illustrates a schematic block diagram of an embodiment of a renewable power system with both a pressure-based power generator and a thermoelectric generator.

The word "exemplary" or "embodiment" is used herein to mean "serving as an example, instance, or illustration." Any implementation or aspect described herein as "exemplary" or as an "embodiment" is not necessarily to be construed as preferred or advantageous over other aspects of the disclosure. Likewise, the term "aspects" does not require that all aspects of the disclosure include the discussed feature, advantage, or mode of operation. Obviously, self-propelled and auto-adjustable inline inspection vehicle may solve such challenges.

Embodiments will now be described in detail with reference to the accompanying drawings. In the following description, numerous specific details are set forth in order to provide an understanding of the aspects described herein. It will be apparent, however, to one skilled in the art, that these and other aspects may be practiced without some or all of these specific components or with alternate components. In addition, well known steps in a method of a process may be omitted presented herein in order not to obscure the aspects of the disclosure. Similarly, well known components in a device may be omitted from figures and descriptions thereof presented herein in order not to obscure the aspects of the disclosure.

One of the present embodiments includes a thermoelectric generator and a pressure-based power generator. It combines both generators with a unified power system including regulators, high density batteries, battery chargers, cooling system, and insulation fillers and barriers to provide an inline inspection tool with continuously renewable power resources. The thermoelectric generator produces electricity by consuming thermal energy from the heat of the product in the pipeline such as oil or gas. The thermal to electric energy conversion can be performed using solid state electrical components built with semiconductor materials (such as bismuth telluride) which are good conductors of electricity but poor conductors of heat. The pressure-based power generator generates electricity by using a unique structure and rotary connection axis for the turbine machine, which drives an alternator to generate electrical energy.

In the process of transporting natural gas through a pipeline, the pipeline may generate hydrate with a decrease in temperature. This process causes the pipeline section to become smaller and volumetric efficiency to become lower. Thus, a method of dehydration, heating usually, is used to transport the natural gas, and the starting temperature is around 60° C. The temperature of a crude oil pipeline ranges from 40° C. to 70° C. or so. Therefore, the transmission medium's temperatures of pipelines are high enough for a thermoelectric generator to produce electric power.

Traditionally most electricity is generated through a rotating turbine device. However, a thermoelectric circuit composed of materials of different Seebeck coefficient (p-doped and n-doped semiconductors) may be configured as a thermoelectric generator. The thermoelectric generator is operated to generate electrical power via an applied thermal gradient in what is called a "Seebeck" mode. The Seebeck principle describes that if two wires of different materials are joined at their ends, forming two junctions, and one junction is held at a higher temperature than the other junction, a voltage difference will arise between the two junctions.

Although these materials still remain the cornerstone for commercial and practical applications in thermoelectric power generation, significant advances have been made in synthesizing new materials and fabricating material structures with improved thermoelectric performance. Recent research has focused on improving the material's dimensionless figure-of-merit (ZT), and the conversion efficiency depends on the dimensionless figure of merit of thermoelectric materials ZT, represented by the following equation:

$$ZT=(\alpha^2\sigma/\kappa)T$$

Conceptually, to obtain a high ZT, both Seebeck coefficient ($\alpha$) and electrical conductivity ($\sigma$) must be large, while thermal conductivity ($\kappa$) must be minimized so that the temperature difference producing Seebeck coefficient ($\alpha$) can be maintained.

In one known embodiment described in CN103928604B, a bismuth telluride based thermoelectric material is commercially prepared using the zone melting, n-type bismuth telluride thermoelectric material ZT highest value 0.80-1.0, and P-type bismuth telluride based thermoelectric material is 0.90-1.1 highest ZT.

U.S. Provisional Patent No. 62/790,971 filed on Jan. 10, 2019 entitled "A Renewable Power System and Method for Pipeline Inspection Tools" describes smart inline inspection tools with renewable power systems for a self-propelled inline inspection tool and adaptive control. This application describes electricity generation by using the heat source inside a pipeline. The transmission medium in the pipeline includes natural gas, oil, or other substance. In addition, the pressure energy in a pipeline may also potentially generate electricity through a rotating turbine device. Gas Pipeline pressure delivery mode is generally used up to 12 MPa or more. For example, the maximum working pressure across the Strait of Sicily Ah a gas pipeline intended to 15 MPa, the Chinese West-East gas pipeline operates around pressure of 10 MPa for phase I, and second-line in phase II at 12 MPa. So, gas pipelines usually contain a huge amount of pressure energy.

Based on investigations on the oil pipelines, the operational pressure range could be from 4 to 10 MPa. Even though this pressure range is lower than gas pipelines, oil pipelines may also provide a large source of pressure energy.

The reality today is that this great pressure in pipelines has not been utilized effectively. It could be a valuable power resource for pipeline Inspection Tools by properly using energy conversion technologies. Relative to the slower moving pipeline inspection devices, there should be a speed difference between the product, either fluid or gas, transported by the pipeline and the device. This difference in potential energy may be utilized.

U.S. Provisional Patent No. U.S. 62/925,861 filed on Oct. 25, 2019 entitled "A Pressure-based Power Generation System and Method for Pipeline Inspection Tools" tries to provide smart inline inspection tools with renewable power systems for self-propelled inline inspection tool and adaptive control. This application describes electricity generation by using the pressure energy inside an oil or gas pipeline as described further herein.

FIG. 1A illustrates a schematic block diagram of an embodiment of a renewable power system 100 with both a pressure-based power generator 101 and a thermoelectric generator 102. In this embodiment, the two types of generators are both present and work together to generate power in the renewable power system 100. In one or more other embodiments, the renewable power system 100 may only include the pressure-based power generator 101 or the thermoelectric generator 102.

The pressure-based power generator 101 includes a turbine machine 111, connection axis 113 and alternator 112. The pressure-based generator 101 may be combined and unified with the thermoelectric generator 102, and jointly share the auxiliary part 103 which includes the regulator section and charging components 131, and a group of high density batteries 132, as well as the unified cooling system 133.

Figure 1B:
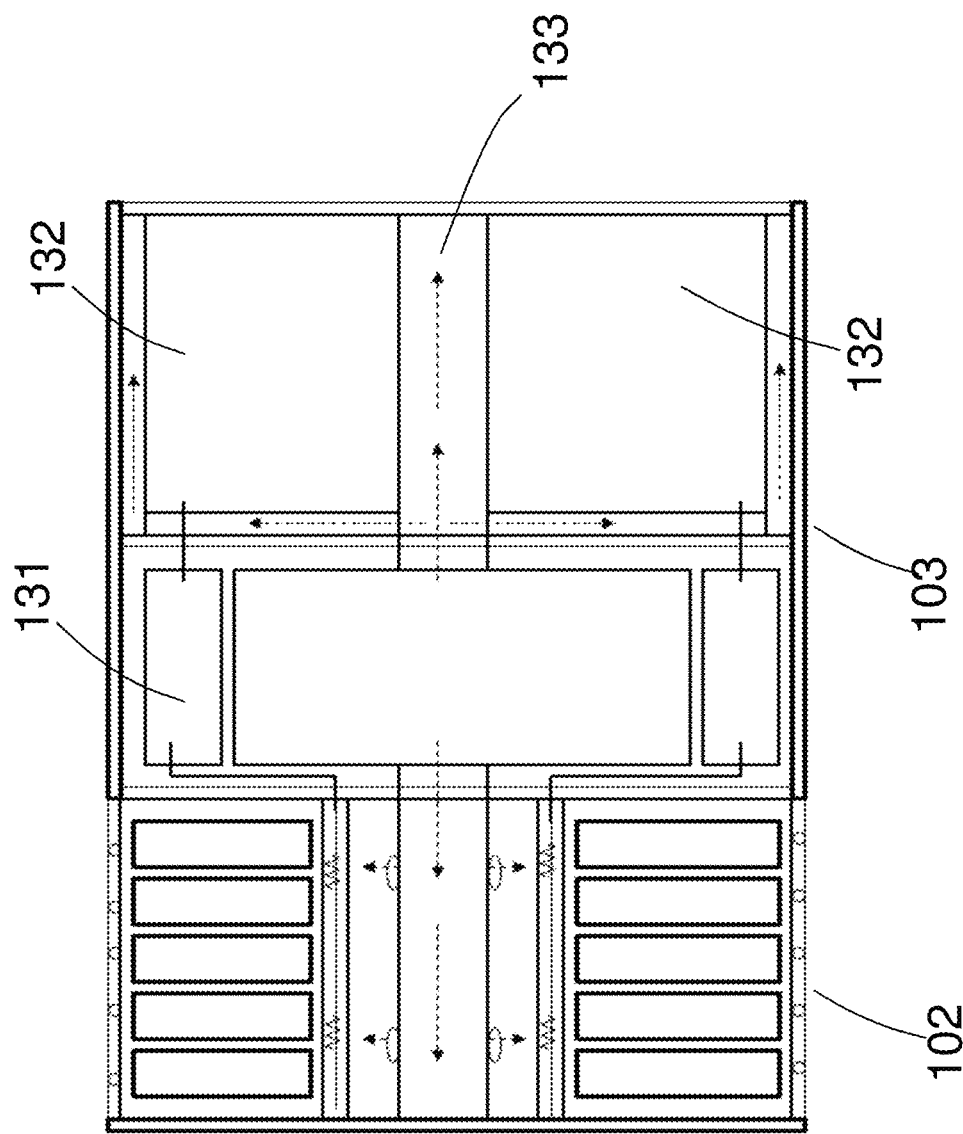
FIG. 1B illustrates a schematic block diagram of an embodiment of the renewable power system with a thermoelectric generator.

FIG. 1B illustrates a schematic block diagram of an embodiment of the renewable power system 100 with the thermoelectric generator 102. In this embodiment, only the thermoelectric generator 102 is combined with the auxiliary part 103 which includes the regulator section and charging components 131, and a group of high density batteries 132, as well as the unified cooling system 133.

For heavy crude oil, high-condensation crude oil and high-wax crude oil, the operation efficiency of the turbine machine 111 may not be sufficient for operation, but high pipeline operation temperature may be adopted and supplemented with a resistance-reducing agent. Therefore, it may be more suitable to apply the thermoelectric generator 102 shown in FIG. 1B in such situations.

Figure 1C:
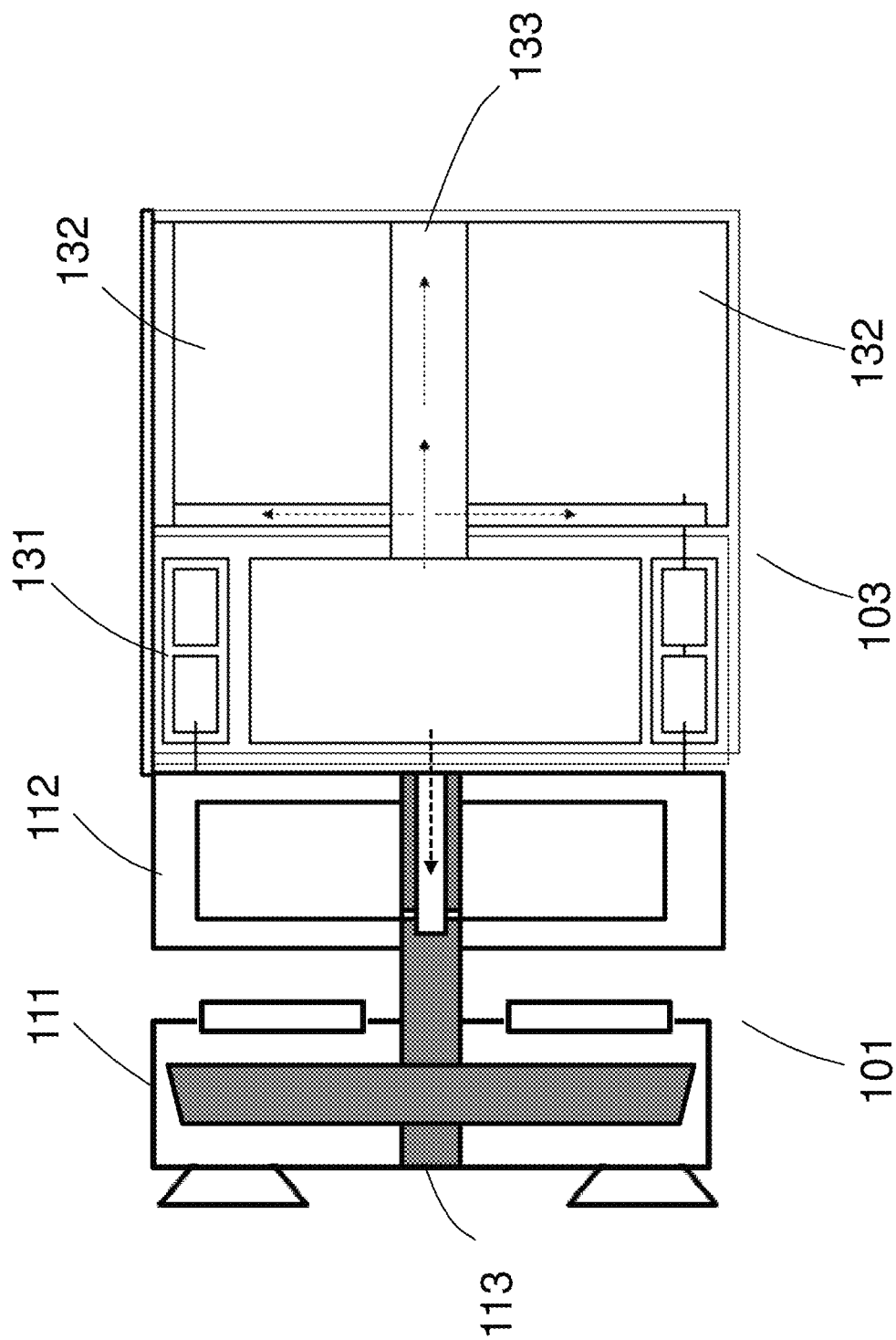
FIG. 1C illustrates a schematic block diagram of an embodiment of the renewable power system with a pressure-based power generator.

FIG. 1C illustrates a schematic block diagram of an embodiment of the renewable power system 100 with a pressure-based power generator 101. This embodiment may be suitable for those scenarios with lower operation temperature. The pressure-based power generator 101 with turbine machine 111, connection axis 113 and alternator 112 for pipelines could be combined solely to the auxiliary part 103 which includes the regulator section and charging components 131, and a group of high density batteries 132, as well as the unified cooling system 133. If the gas pipeline adopts a method of adding a hydrate inhibitor to prevent or eliminate the formation of hydrates, instead of using heating, it is suitable to use a pressure-based power generator 101 shown in FIG. 1C.

Figure 2:
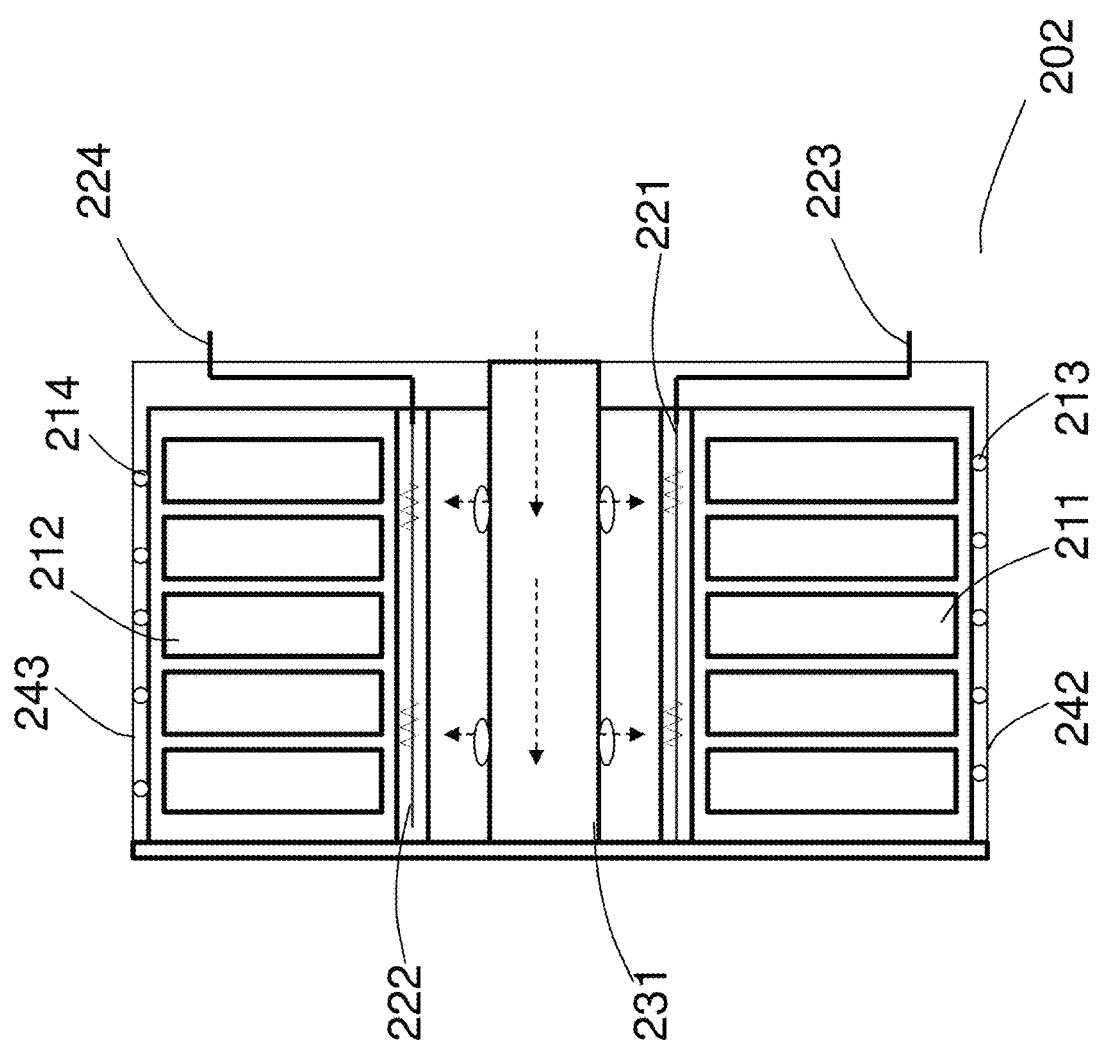
FIG. 2 illustrates a schematic block diagram of an embodiment of the thermoelectric generator.

FIG. 2 illustrates a schematic block diagram of an embodiment of the thermoelectric generator 202. The thermoelectric generator 202 has one or more hot surfaces 242, 243, and one or more cold surfaces 231. The one or more hot surfaces 242, 243 are heated by the transmission medium in the pipeline. Heat transfer support structures 213, 214 are utilized in the thermoelectric generator 202 to transfer the thermal energy from the hot surfaces 242, 243 and heat source (e.g., the transmission medium) in the pipeline to one end of the semiconductor components 211, 212. For example, the heat transfer support structures 213, 214 may include hole-like structural components. An electric current is generated via the thermal gradient between the hot surface 242, 243 and the cold surface 231, and then conducted by the wires 221, 223 or 222, 224 to the auxiliary part 103, as shown further in FIG. 8.

Figure 3:
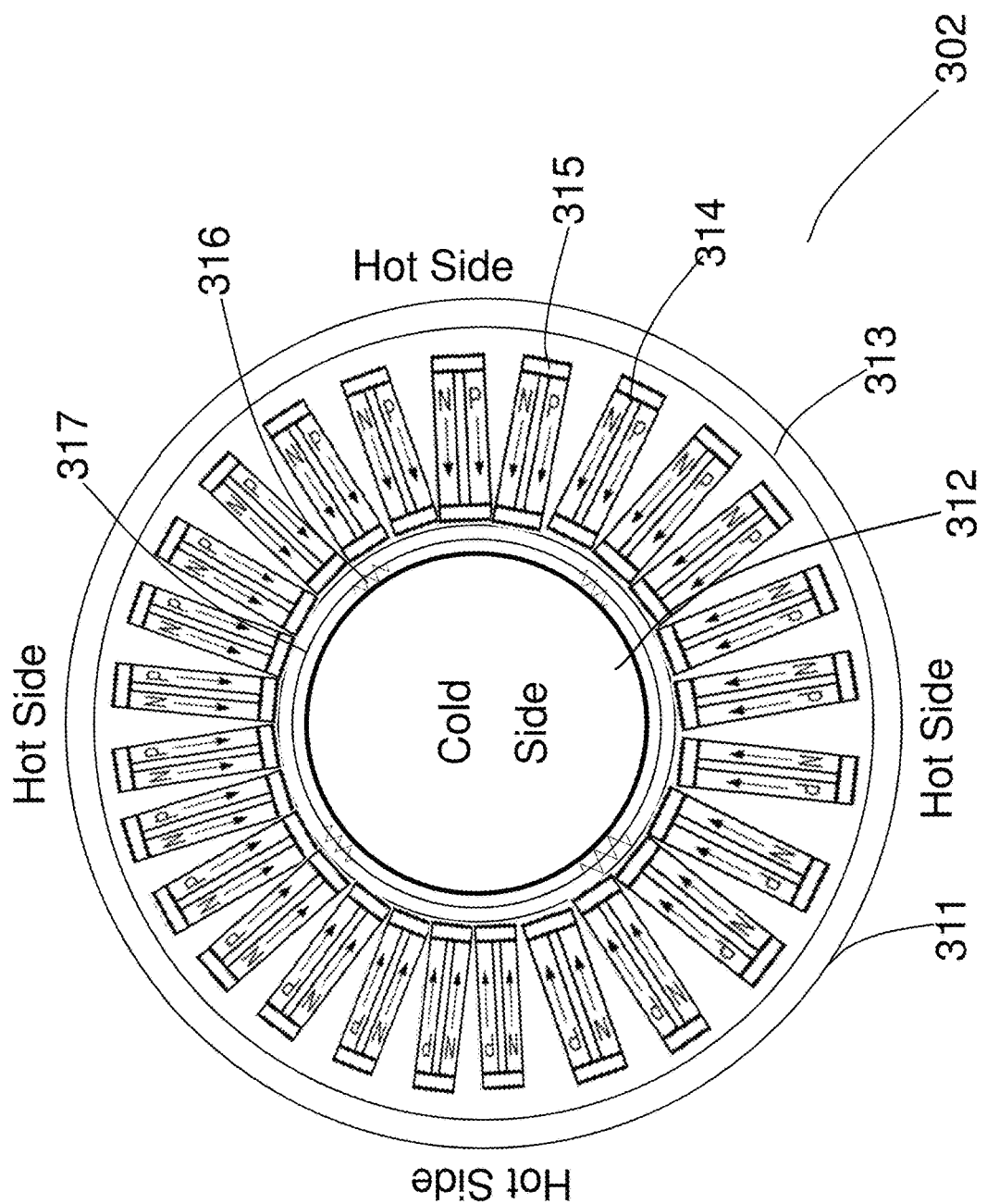
FIG. 3 illustrates a schematic block diagram of a cross section of the thermoelectric generator.

FIG. 3 illustrates a schematic block diagram of a cross section of the thermoelectric generator 202 shown in the FIG. 2 embodiment. On the hot surface 242, 243 shown in FIG. 2, there is an outer layer 311 and an inner layer 313. For example, the outer layer 311 may be distributed with a uniform hole-like structure to support the effective conduction of thermal energy of the pipeline. The inner layer 313 may serve as the inner lining layer of the hot surface and the protective layer of the thermoelectric generator 302, and has multiple functions such as heat conduction and sealing. In this example embodiment, there are 26 thermoelectric modules 314, 315, though a different number or size of thermoelectric modules may be implemented instead. In each thermoelectric module 314, 315, two wires of different materials shown as p-doped and n-doped semiconductors are joined at their ends: one junction is held at the hot surface and the other junction is at the cold surface 312. The thermoelectric modules 314, 315 are constructed in parallel, but their electric circuits like 316, 317 are connected in serial at the cold surface 312. For the cold surface 312, it is also explained with respect to FIG. 7.

Figure 4:
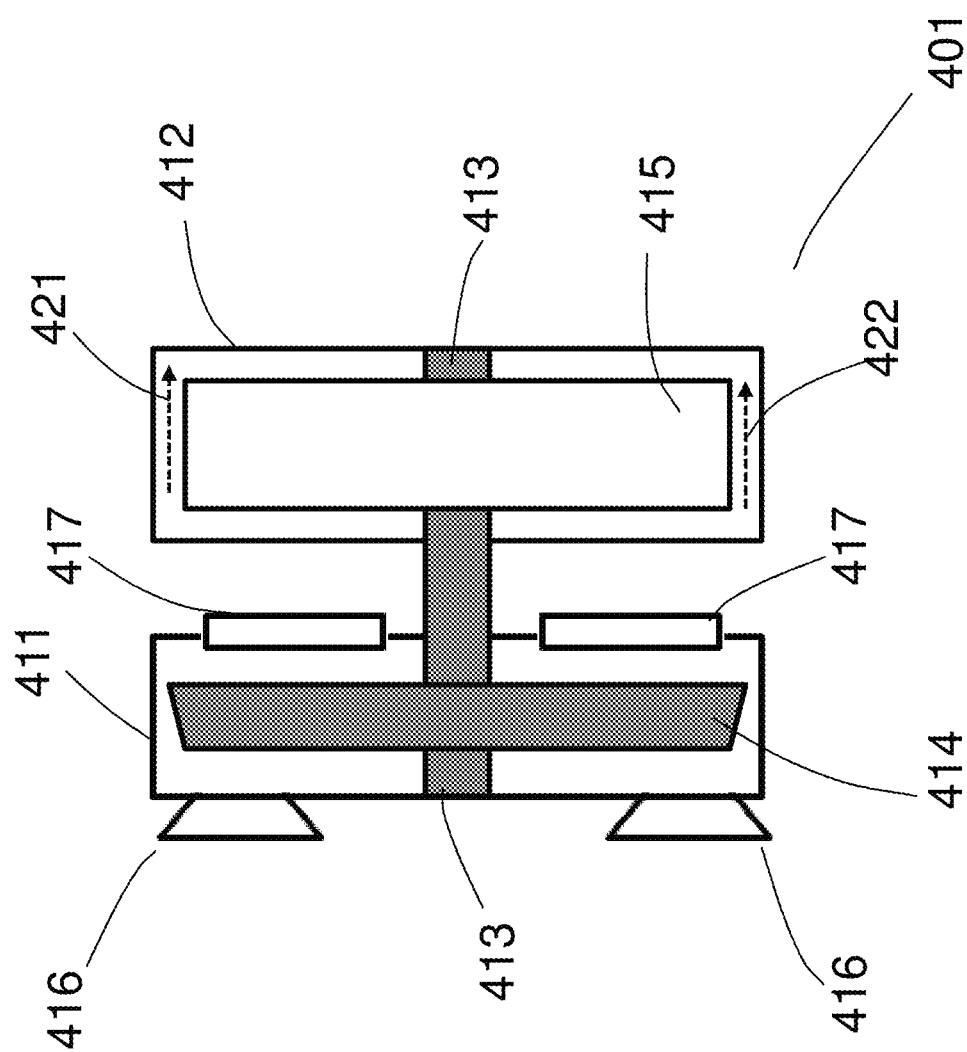
FIG. 4 illustrates a schematic block diagram of an embodiment of the pressure-based power generator for pipelines.

FIG. 4 illustrates a schematic block diagram of an embodiment of the pressure-based power generator 401 for pipelines. An enclosure 411 is configured as the container or case for the turbine wheel 414. Another enclosure 412 is configured as the case of the alternator 415. There are multiple inlets 416 and outlets 417 for the high pressured transmission medium, such as oil or gas streams or other substances, transported by the pipeline. The flow of the transmission medium through the enclosure 411 turns the turbine wheel 414 and generates mechanical energy. The connection axis 413 transfers the mechanical energy from the turbine wheel 414 to the alternator 415.

During the process of the power generation by the pressure-based power generator 401, the alternator 415 converts the mechanical energy into electrical power. In an embodiment, the alternator 415 may also generate heat energy as a side-product. So, the alternator's container 412 may be insulated and sealed well to retain the generated heat. The rotation of the rotor and the rotor's shape may be specially designed as a fan to push the heat from the alternator 415 and into the container 412 because it could be an important resource and passed to the thermoelectric generator 102. So, a mechanism of transferring the heat energy 421, 422 generated by the alternator 415 to the thermoelectric generator 102 may be implemented, such as a fan or other means.

In an embodiment, the setting of the thermoelectric modules 314, 315 in the system 100 may be different from the configuration shown in FIG. 2 and FIG. 3. For example, the thermal energy 421, 422 generated by the pressure-based power generator 401 is configured as the hot surface, and a cold source of the cooling system 133 is configured as the cold surface 312 to implement the thermoelectric modules 314, 315 in the system 100. The structure, size, and layout of the thermoelectric module configuration can be determined according to the available space (effective space) in the chassis. The pressure-based power generator 401 thus includes at least one thermoelectric module 314, 315 for converting the heat generated by the alternator 415 into electrical energy.

Figure 5A:
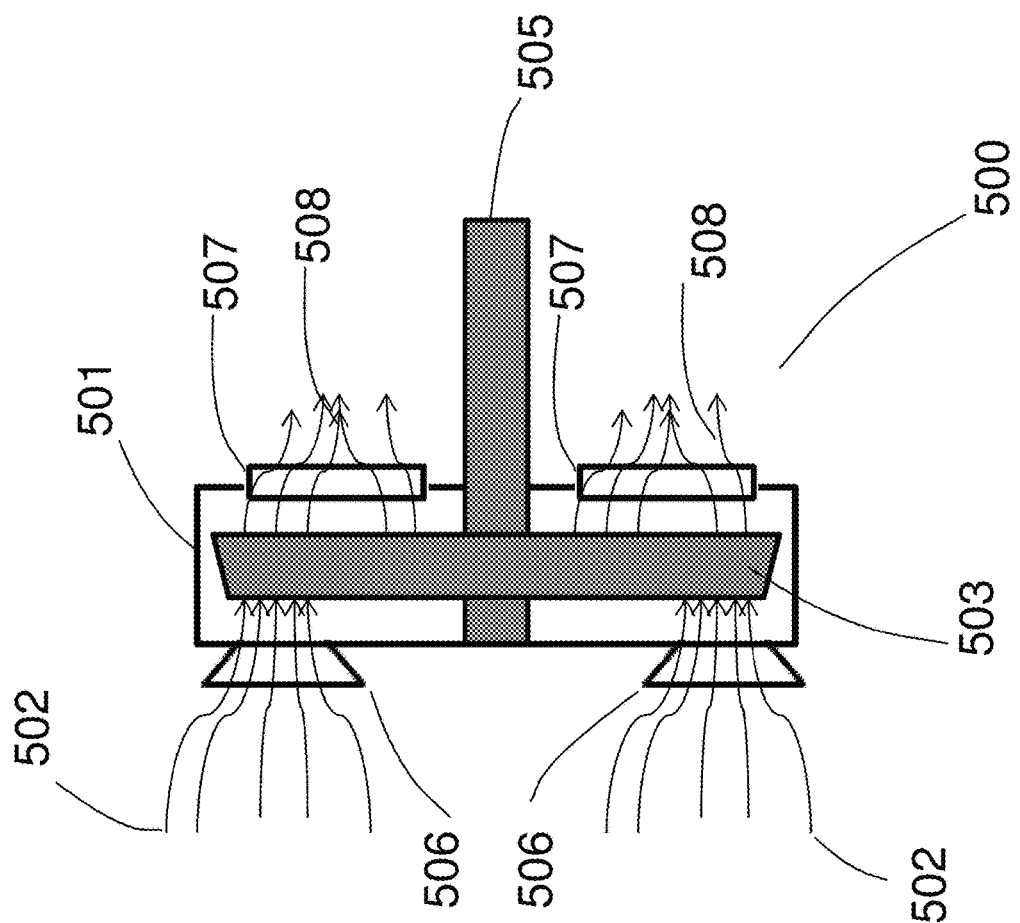
FIG. 5A illustrates a schematic block diagram of an embodiment of the turbine machine of the pressure-based power generator for pipelines in use.

FIG. 5A illustrates a schematic block diagram of an embodiment of the turbine machine 500 of the pressure-based power generator 401 for pipelines in use. During operation in a pipeline, an incoming stream 502 formed by the transmission medium (e.g., oil or gas) flows into case 501 through inlets 506 drives the turbine wheel 503, and then becomes an outgoing stream 508 that flows out of the case 501 via outlets 507. Because this pressure-based power generator 401 is connected to the pipeline inspection tool, its body's weight and shape should make it move slower inside the pipeline than the high pressure product stream (either oil or gas). The high pressure stream with faster speed contains kinetic energy. Therefore, the turbine wheel 503 with curved surfacing blades shown in FIG. 5B is driven effectively and efficiently by the high pressure stream of the transmission medium.

Figure 5B:
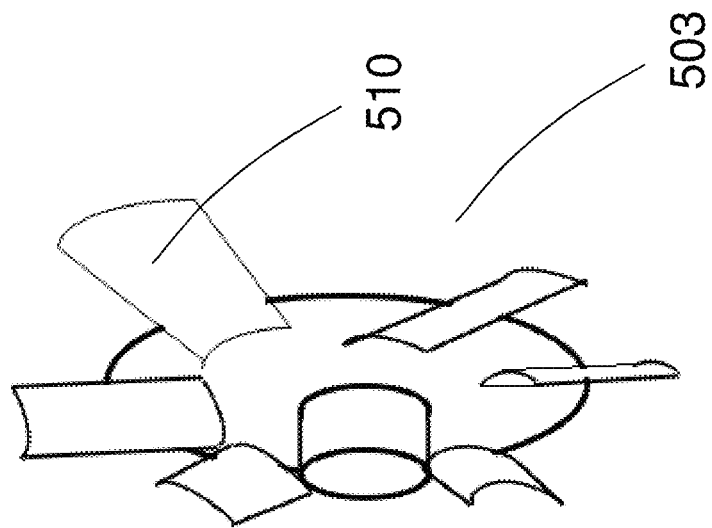
FIG. 5B illustrates a schematic block diagram of an embodiment of the curved surfacing blades of the turbine wheel in the pressure-based power generator.

FIG. 5B illustrates a schematic block diagram of an embodiment of the curved surfacing blades 510 of the turbine wheel 503 in the turbine machine 500 of the pressure-based power generator 401. The curved surfacing blades 510 are configured to turn the turbine wheel 503 in response to the high pressure stream of the oil or gas or other substance in the pipeline.

Figure 6A:
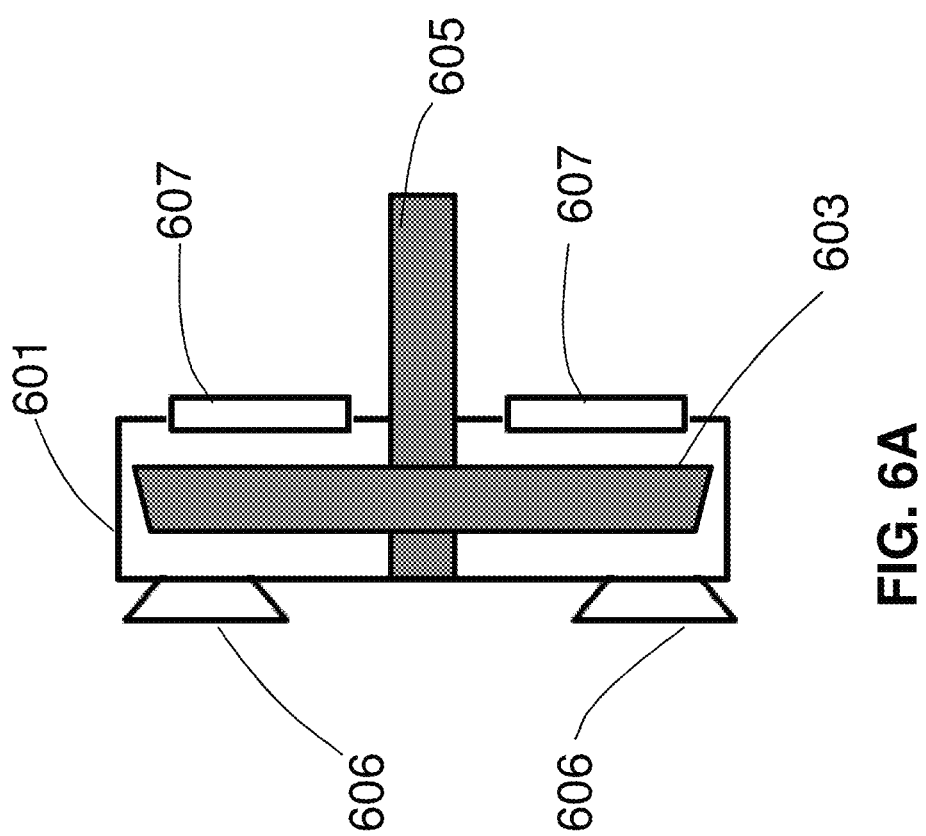
FIG. 6A illustrates a schematic block diagram of an embodiment of the pressure-based power generator's turbine machine in more detail.

FIG. 6A illustrates a schematic block diagram of an embodiment of the pressure-based power generator's turbine machine 500 in more detail. In this embodiment, the inlets 606 on the enclosure 601 are formed on a first side of the enclosure 601 in a trapezoid shape, wherein the larger side is outside of the enclosure 601, and the smaller side is inside the enclosure 601. The outlets 607 are configured on an opposite side of the enclosure 601.

Figure 6B:
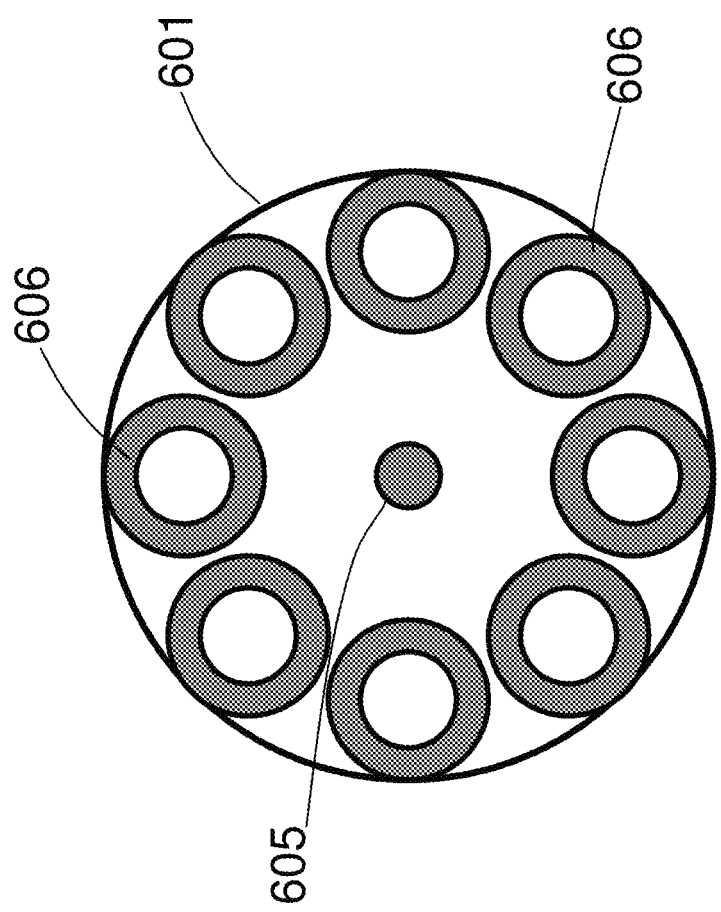
FIG. 6B illustrates a schematic block diagram of an embodiment of a back view of the inlets of the pressure-based power generator's turbine machine in more detail.
Figure 6B:
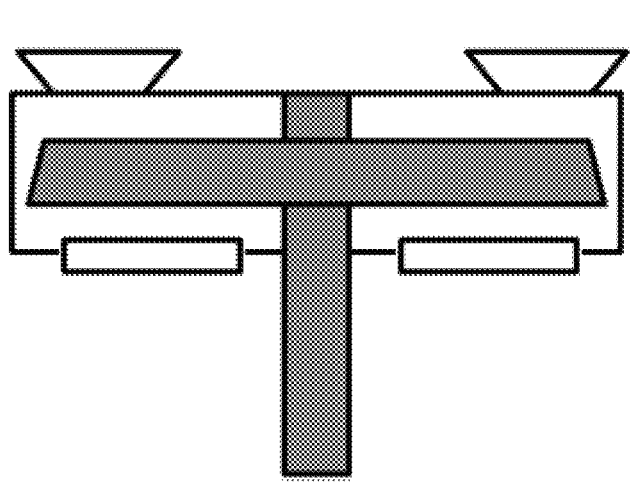

FIG. 6B illustrates a schematic block diagram of an embodiment of a back view of the inlets 606 of the pressure-based power generator's turbine machine 500 in more detail. The back view shown in FIG. 6B illustrates the funnel shaped inlets 606 and their layout on the back side of the enclosure 601, wherein its outside circle has a larger diameter than the inside circle.

Figure 6C:
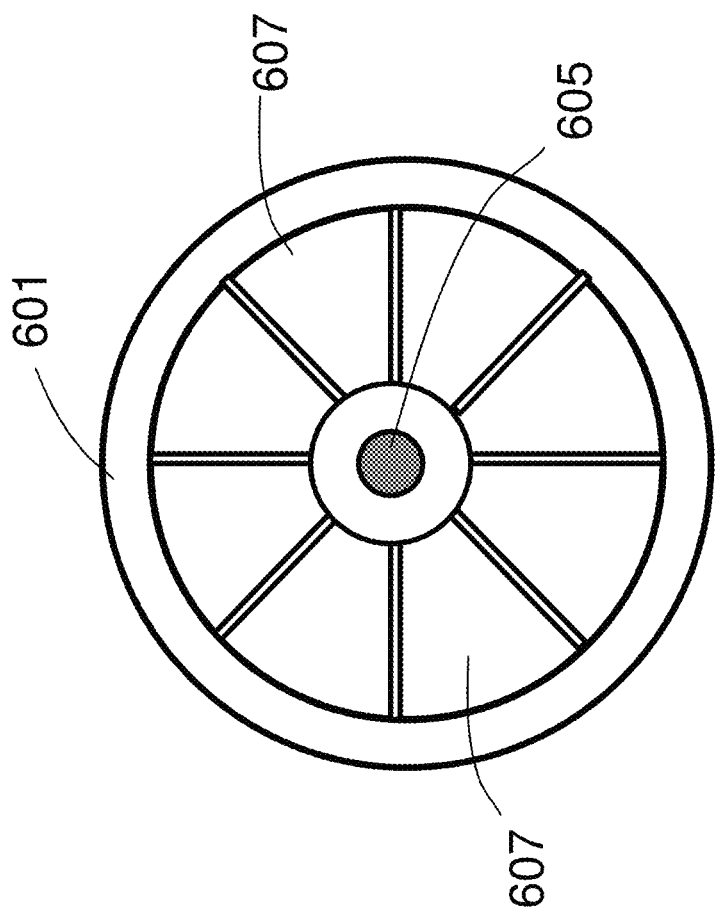
FIG. 6C illustrates a schematic block diagram of an embodiment of a front view of the outlets of the pressure-based power generator's turbine machine in more detail.
Figure 6C:
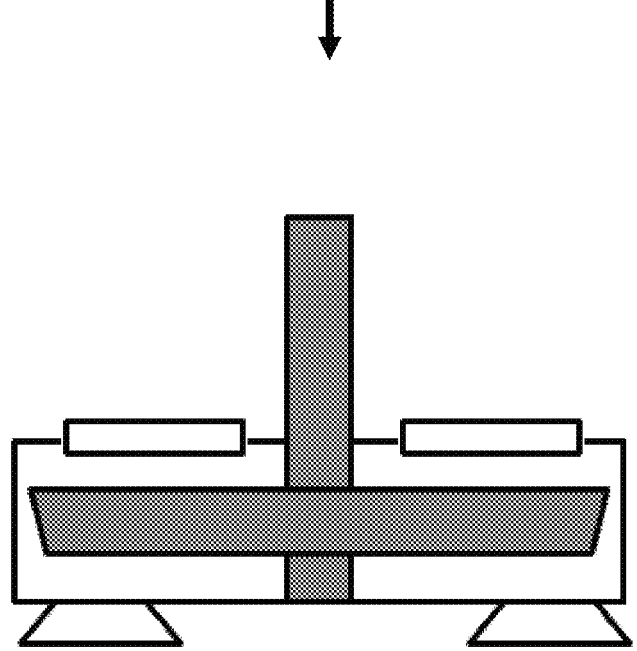

FIG. 6C illustrates a schematic block diagram of an embodiment of a front view of the outlets 607 of the pressure-based power generator's turbine machine 500 in more detail. There are a plurality of outlets 607 on the enclosure 601. Each outlet 607 is similar to a sector shape, so that its space or size is much larger than the corresponding inlet 606 on the other side of the enclosure 601, and the outgoing stream may flow out easily and quickly. In general, the combined openings of the plurality of outlets 607 are larger, e.g. have a greater area, than the combined openings of the plurality of inlets 606.

Concurrently, the next wave of the incoming product stream also flows into the enclosure 601 and drives the turbine wheel 603 continuously and efficiently. A uniform distribution for the turbine wheel blades 510, inlets 606, and outlets 607 with corresponding positions properly aligned, effectively guide the stream's flow from an inlet 606 to an outlet 607 to drive the rotation of the turbine wheel 603 or 503.

Figure 7A:
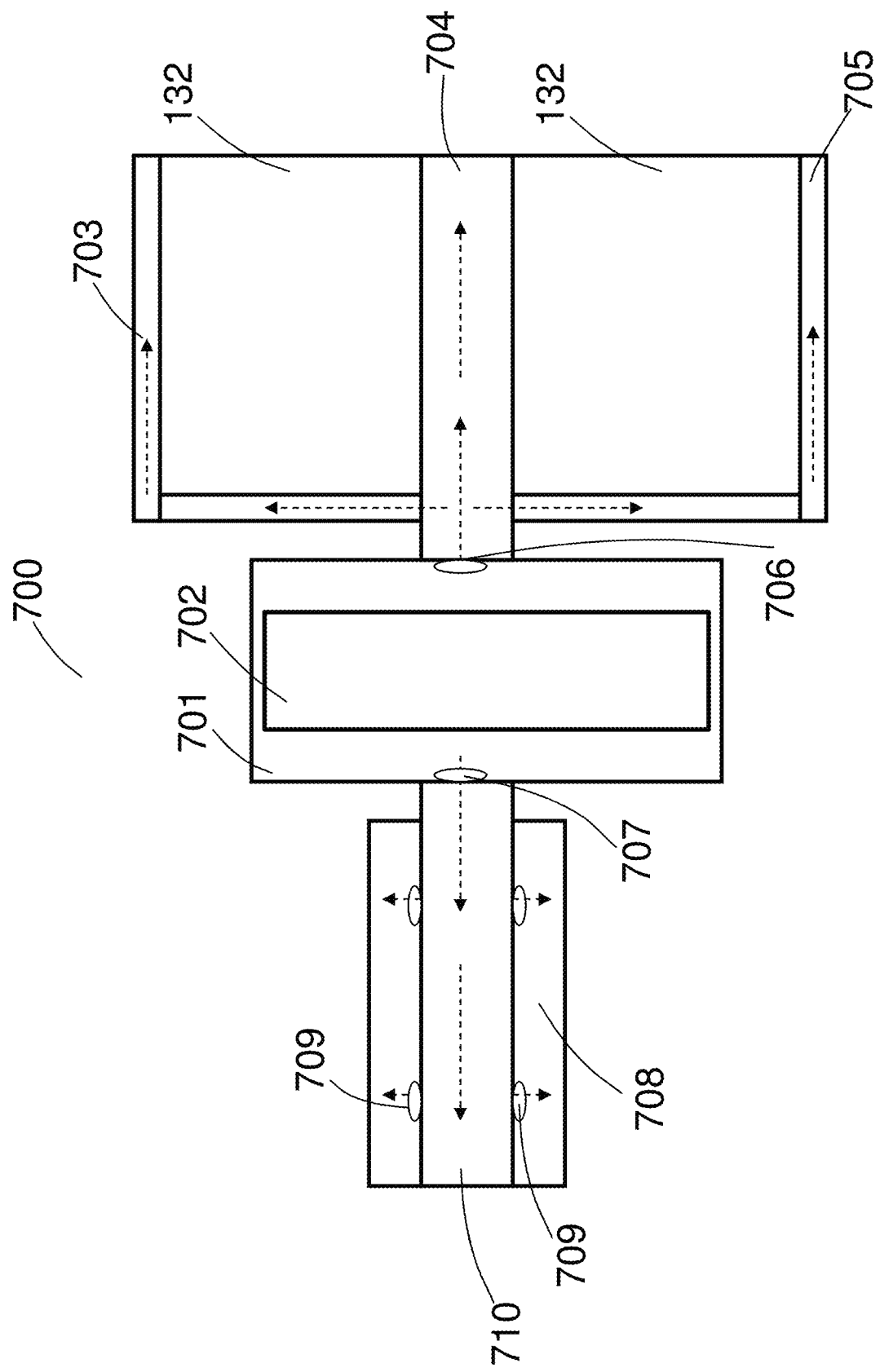
FIG. 7A illustrates a schematic block diagram of an embodiment of a cooling system in more detail.

FIG. 7A illustrates a schematic block diagram of an embodiment of a cooling system 700 in more detail. The renewable power system 100 utilizes a unified cooling system 700, which has a core storage compartment 701 that stores a coolant or special cooling material 702. The cooling system 700 is shared by both the pressure-based power generator 401 and the thermoelectric generator 202 as well as the batteries 132. For example, the cooling system 700 services the pressure-based power generator 401 and the thermoelectric generator 202 through a first cool trunk 710 and by the batteries through a second cool trunk 704. The sub-cooling system for the batteries 132 includes a thermal controller 706, and outer cooling layer 703, 705 configured to maintain the batteries 132 within a predetermined temperature tolerance range.

The sub-cooling system for the pressure-based power generator 401 and the thermoelectric generator 202 also includes a thermal controller 707 for the first cool trunk 710, and multiple thermal controllers 709 which control a temperature of cool box 708 to meet the requirement of the cold surface 312 for the thermoelectric modules 314, 315. Furthermore, the cold surface 312 of the thermoelectric modules 314, 315 is supported by the cooling box 708 to meet the requirements of the cold surface 312 of the thermoelectric modules 314, 315 in the thermoelectric generator 202. For example, the thermal controller 706, 707, 709 may be, for example, a valve for controlling the flow rate of cooling media (coolant) from the core storage compartment 701, and the amount of cooling media passing through the valve may be controlled by controlling the degree of opening or closing of the valve.

Figure 7B:
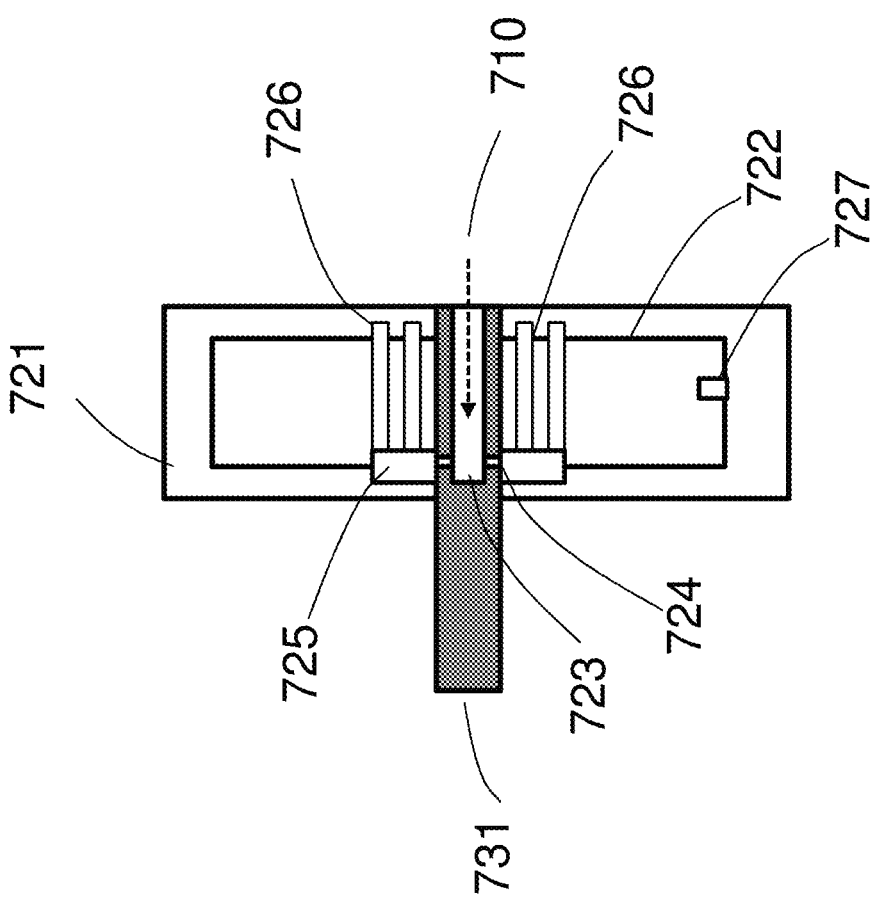
FIG. 7B illustrates one example embodiment of the cooling system for the alternator in the pressure-based generator.

FIG. 7B illustrates a schematic block diagram of another embodiment of the cooling system 700 in more detail. The unified cooling system 700 may also prevent an alternator 722 in an enclosure 721 from overheating by suppling cooling media 710 through the connection axis 731. A cooling coil 726 is attached to the alternator 722 through a hollow tunnel 723 and a cooling hole 724 formed on the connection axis 731 as well as a cooling circular box 725. Thermal state sensors 727 and thermal controllers 706, 707, 709 may be implemented to monitor and adjust the operation temperatures at different sections or points of the renewable power system 100. For example, a plurality of thermal state sensors 727, such as temperature sensors, obtain temperatures at multiple locations within the renewable power system 100. Then, one or more thermal controllers 706, 707, 709 may adjust the temperatures of the multiple locations within the renewable power system 100 using the obtained temperatures.

Figure 7C:
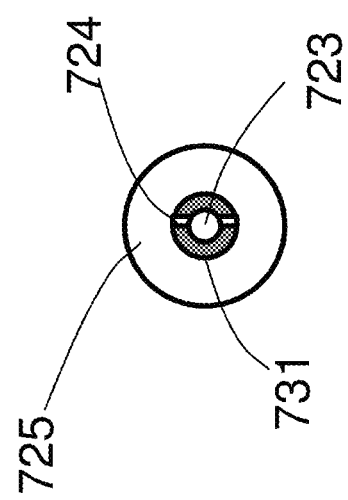
FIG. 7C illustrates a side view of the cooling system for the alternator.

FIG. 7C illustrates a side view of the cooling system 700 for the alternator 722. The cooling circular box 725 is configured to form the hollow tunnel 723 on the connection axis 731 with the cooling coil 726 and coiling openings 724. The hollow tunnel 723 includes the cooling openings 724 in a radial direction, and the hollow tunnel 723 connects with the cooling circular box 725 through the cooling openings 724. The cooling circular box 725 is connected to the cooling coil 726 inside the alternator 722 to provide cooling for the alternator 722.

Figure 8A:
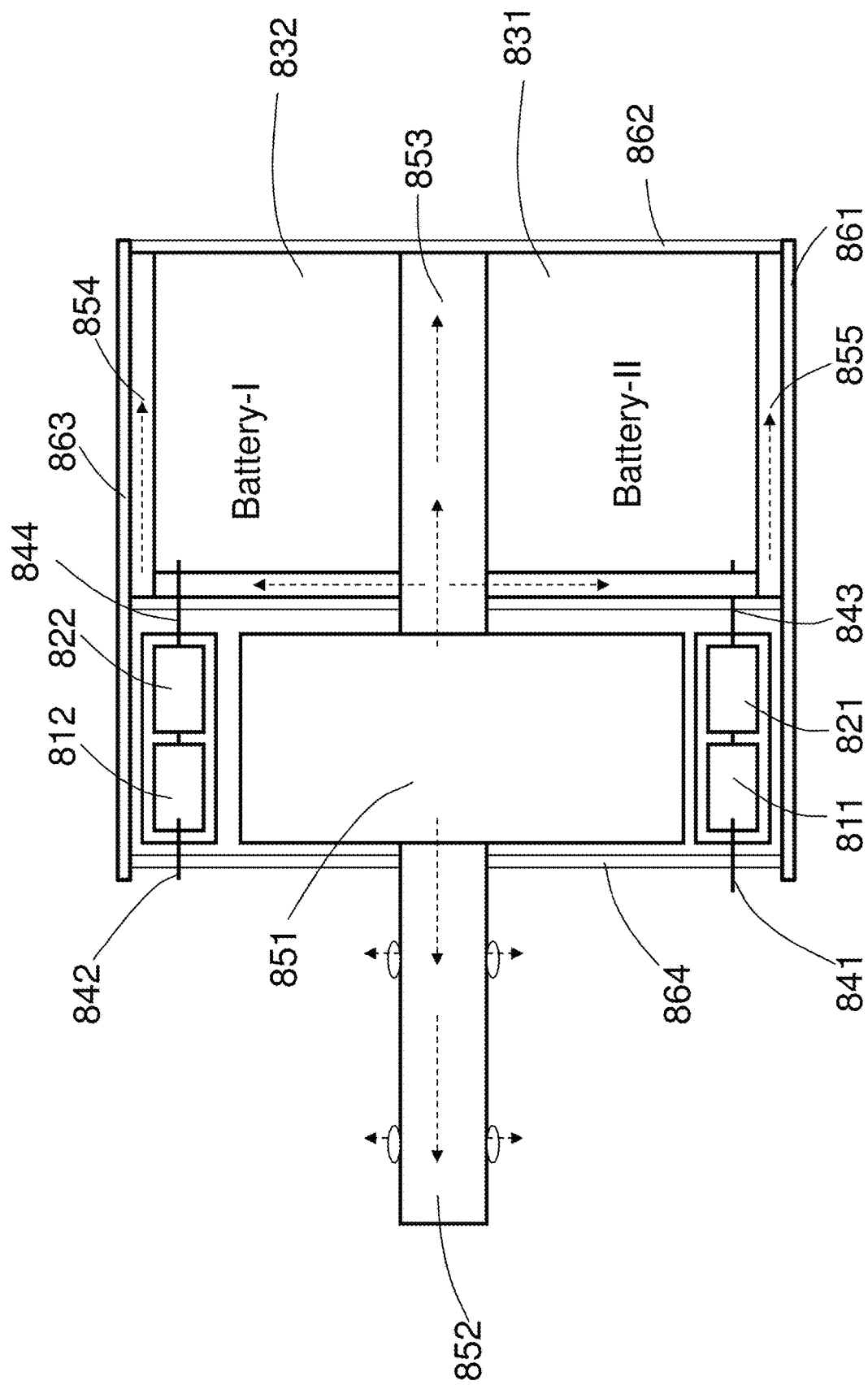
FIG. 8A illustrates a schematic block diagram of an embodiment of the auxiliary part for the renewable power system.

FIG. 8A illustrates a schematic block diagram of an embodiment of the auxiliary part 103 for the renewable power system 100. The auxiliary part 103 includes regulators 811, 812 to connect the pressure-based power generator 401 and the thermoelectric generator 202 through wires 841, 842 to meet the power system requirements. Chargers 821, 822 connect a group of high density batteries 831, 832 through wires 843, 844. Insulation barriers 861, 862, 863 and 864 are applied to protect the renewable power system 100 and components by isolating them from external hot sources. The cooling system 700 components 851, 852, 853, 854 and 855 also protect the renewable power system 100 and components by keeping the temperatures within working conditions.

Figure 8B:
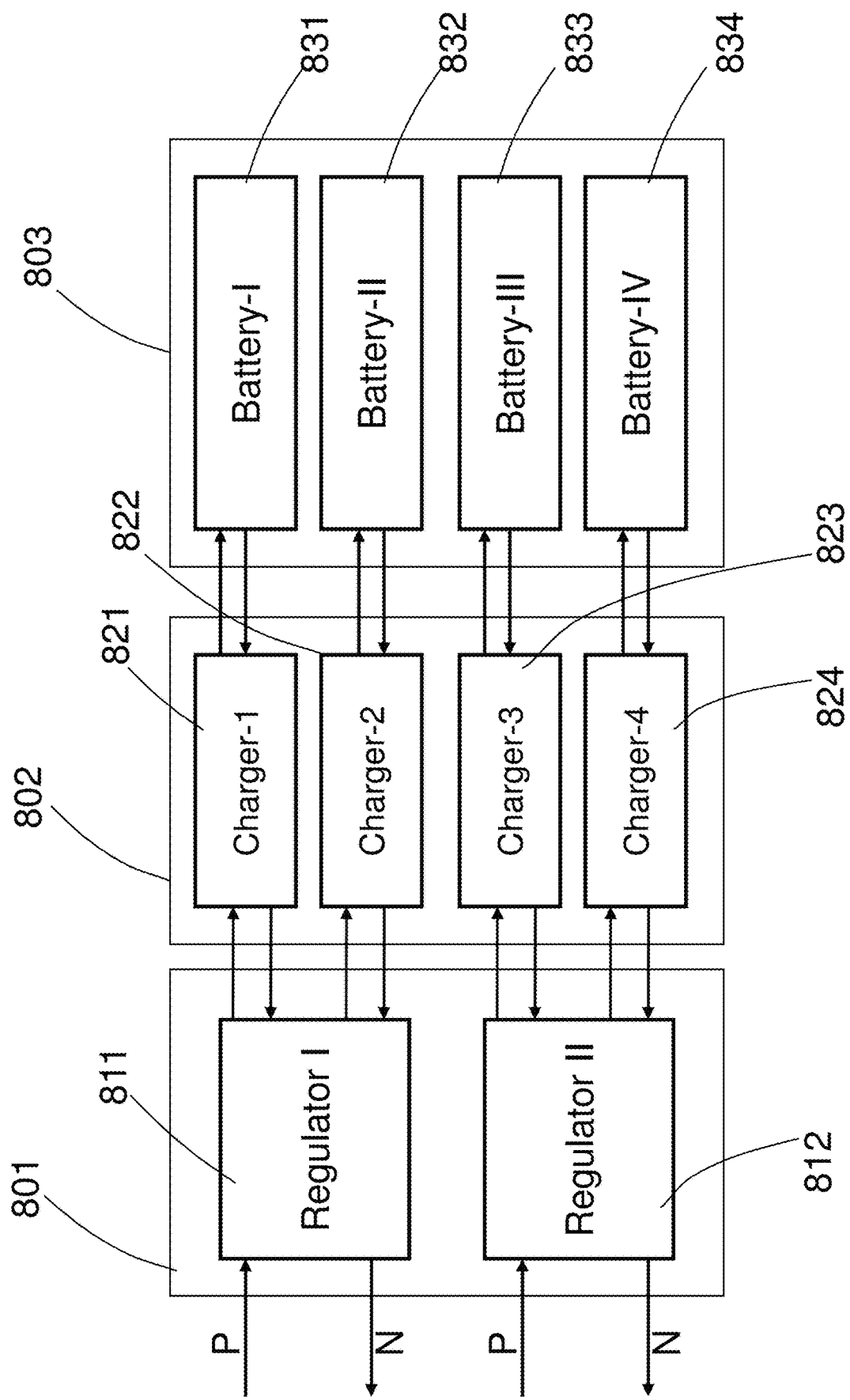
FIG. 8B illustrates a schematic block diagram of an embodiment of a linear view of the auxiliary part for the renewable power system.

FIG. 8B illustrates a schematic block diagram of an embodiment of a linear view of the auxiliary part 103 for the renewable power system 100. The auxiliary part 103 includes three pieces: a regulator section 801, a charger division 802, and a battery bank 803. The battery bank 803 may have multiple groups of high density batteries 831, 832, 833, and 834 or more for different applications in the pipeline inspection tool. The batteries 831, 832, 833, 834 are coupled with chargers 821, 822, 823, 824 through built-in connections to maintain a high availability of the power supply. The regulator section 801 includes voltage regulator and rectifier components. Two kinds of regulators are implemented in the regulator section 801: regulator I 811 that is an AC regulator connected to the alternator 415, and DC regulator 812 that is connected to the thermoelectric generator 202.

Figure 9:
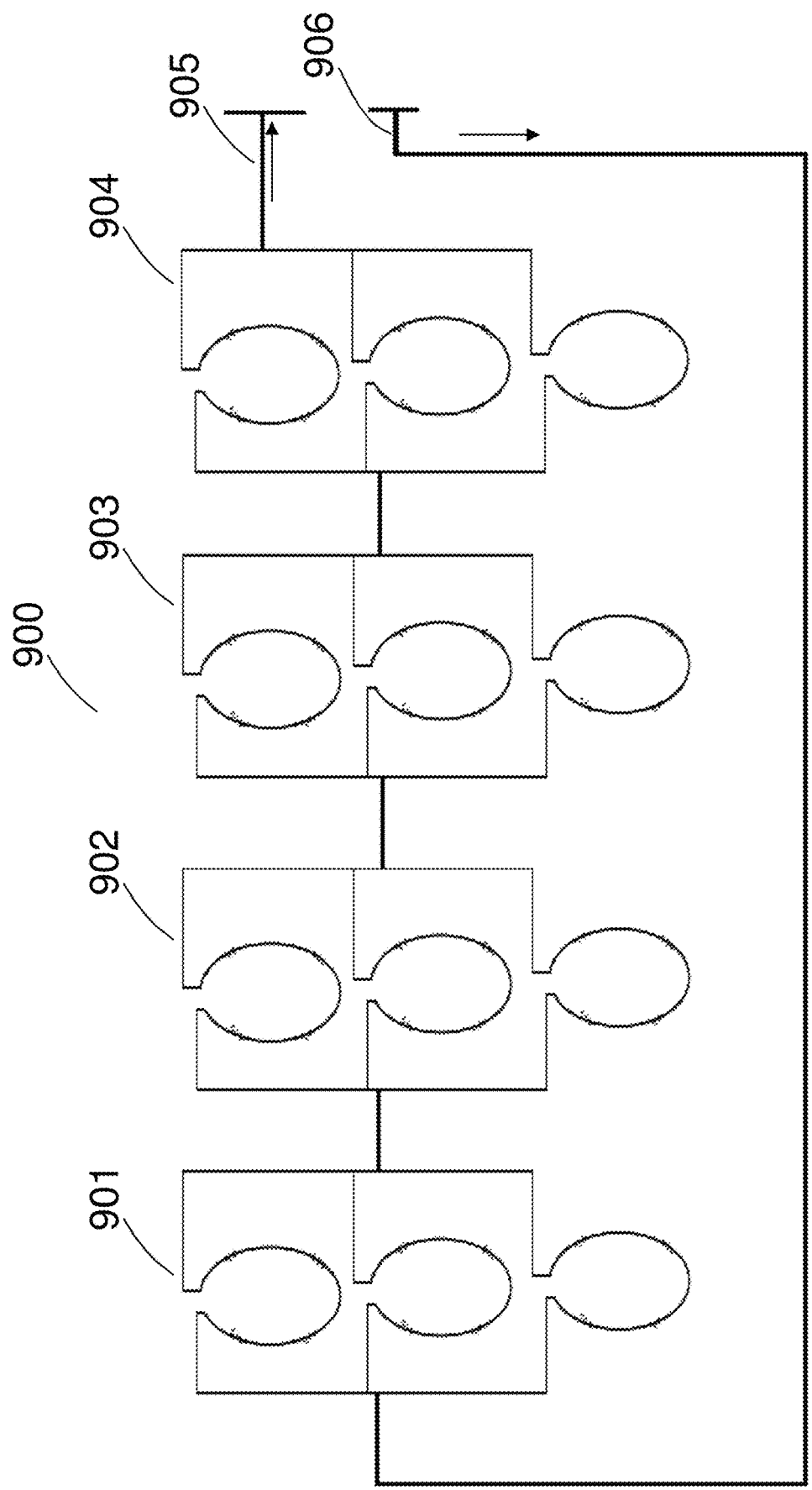
FIG. 9 illustrates a schematic block diagram of an embodiment of a topology of the electric circuit for thermoelectric generator.

FIG. 9 illustrates a schematic block diagram of an embodiment of a topology of the electric circuit 900 for thermoelectric modules. The electric circuit 900 includes combining parallel-series arrangements, which every three circuit units connect in parallel to form new base circuits shown here as 901, 902, 903, 904. The base circuits 901, 902, 903, 904 are connected in serial to form a required current 905, 906 at targeted voltages. Each of the basic circuit units 901, 902, 903, and 904 shown in FIG. 9 includes, for example, three cell circuit units, which can be regarded as three thermoelectric modules, that is, each cell unit can be one thermoelectric module. However, those technical professionals in the area can understand that FIG. 9 is only an exemplary diagram for explaining the principle, and is not intended to be limiting. In the design and implementation, the number of parallel circuit units and the number of basic circuit units can be changed according to specific design requirements. In addition, each cell unit can also be composed of multiple thermoelectric modules, and the principle of combination can be determined according to the actual requirements of the target current and target voltage.

The various features of the disclosure described herein can be implemented in different systems and devices without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

In the foregoing specification, certain representative aspects have been described with reference to specific examples. Various modifications and changes may be made, however, without departing from the scope of the claims. The specification and figures are illustrative, rather than restrictive, and modifications are intended to be included within the scope of the claims. Accordingly, the scope of the claims should be determined by the claims themselves and their legal equivalents rather than by merely the examples described. For example, the components and/or elements recited in any apparatus claims may be assembled or otherwise operationally configured in a variety of permutations and are accordingly not limited to the specific configuration recited in the claims.

Furthermore, certain benefits, other advantages and solutions to problems have been described above with regard to particular embodiments; however, any benefit, advantage, solution to a problem, or any element that may cause any particular benefit, advantage, or solution to occur or to become more pronounced are not to be construed as critical, required, or essential features or components of any or all the claims.

The invention claimed is:

1. A renewable power system for an inline device in a pipeline, comprising:
   at least one of: a thermoelectric generator in the inline device configured to convert thermal energy generated by a transmission medium in the pipeline to electricity or a pressure generator in the inline device configured to convert pressure energy generated by the transmission medium in the pipeline to electricity using a plurality of blades in the inline device; and
   an auxiliary system in the inline device that receives a power supply from at least one of the thermoelectric generator or the pressure generator to power the inline device inside the pipeline.

2. The renewable power system of claim 1, wherein the thermoelectric generator comprises:
   a hot surface and a cold surface;
   one or more heat transfer support structures for transferring the thermal energy generated by the transmission medium in the pipeline to the hot surface;
   a plurality of thermoelectric modules between the hot surface and the cold surface, wherein the plurality of thermoelectric modules generate electricity using a thermal gradient formed between the hot surface and the cold surface.

3. The renewable power system of claim 1, wherein the pressure generator comprises:
   a turbine configured to rotate in response to flow of the transmission medium and generate mechanical energy;
   an alternator for generating electrical energy from the mechanical energy; and
   a connection axis connecting the turbine and the alternator.

4. The renewable power system of claim 3, wherein the turbine comprises:
   the plurality of blades, wherein the plurality of blades are a plurality of uniformly distributed blades having curved surfaces;
   an enclosure for the turbine;
   a plurality of inlets on a first side of the enclosure; and
   a plurality of outlets on an opposite side of the enclosure, wherein openings of the plurality of outlets is greater than openings of the plurality of inlets.

5. The renewable power system of claim 4, wherein a cross section of each of the plurality of inlets has a trapezoidal shape, and wherein a relatively large side of each of the plurality of inlets is located outside the enclosure and a relatively smaller side of each of the plurality of inlets is located inside the chassis.

6. The renewable power system of claim 4, wherein a cross section of the plurality of outlets has a sector shape.

7. The renewable power system according to claim 3, wherein the pressure generator comprises:
   an insulated housing for retaining heat generated by the alternator; and
   a fan for transferring the heat to the thermoelectric module.

8. The renewable power system according to claim 3, wherein the pressure generator comprises:
   an insulated housing for retaining heat generated by the alternator; and
   at least one thermoelectric module for converting the heat into electrical energy.

9. A renewable power system for an inline device in a pipeline, comprising:
   at least one of: a thermoelectric generator configured to convert thermal energy generated by a transmission medium in the pipeline to electricity or a pressure generator configured to convert pressure energy generated by the transmission medium in the pipeline to electricity; and an auxiliary system that receives a power supply from at least one of the thermoelectric generator or the pressure generator, wherein the auxiliary system includes:
- at least one voltage regulator for receiving at least one of alternating current or direct current from at least one of the thermoelectric generator or the pressure generator;
- at least one charger connected to the at least one voltage regulator;
- at least one battery component connected to the at least one charger; and
- a cooling system for providing cooling for at least one of the thermoelectric generator or the pressure generator, and providing cooling for the at least one battery component.

10. The renewable power system of claim 9, wherein the cooling system comprises:
- a core storage compartment that stores a coolant;
- a first cool trunk for providing cooling to the thermoelectric generator; and
- a second cool trunk for providing cooling to the at least one battery component.

11. The renewable power system of claim 10, wherein the cooling system further comprises:
- a plurality of thermal sensors for obtaining temperatures at multiple locations within the renewable power system; and
- one or more thermal controllers configured to adjust the temperatures of the multiple locations within the renewable power system using the obtained temperatures.

12. The renewable power system of claim 11, wherein the one or more thermal controllers comprise:
- at least one thermal controller disposed in the first cool trunk and configured to control an amount of the coolant in the first cool trunk; and
- at least another thermal controller disposed in the second cool trunk and configured to control an amount of the coolant in the second cool trunk.

13. The renewable power system of claim 11, wherein the one or more thermal controllers comprise:
- a thermal controller disposed in the first cool trunk configured to control a temperature of a cold surface of the thermoelectric generator.

14. The renewable power system of claim 9, wherein the cooling system further comprises:
- a cooling coil for providing cooling to an alternator, wherein the cooling coil is located in a hollow tunnel formed on a connection axis of the alternator.

15. The renewable power system of claim 14, wherein the connection axis further forms a plurality of cooling holes positioned in a radial direction from the hollow tunnel, wherein the hollow tunnel connects with a sealed cooling box through the cooling holes, wherein the sealed cooling box is connected to the cooling coil.

16. The renewable power system of claim 2, wherein the plurality of thermoelectric modules are connected in series at a cold surface, and wherein each of the plurality of thermoelectric modules includes a P-type semiconductor and n-type semiconductor.

17. The renewable power system of claim 2, wherein the one or more heat transfer support structures include hole-like structural components.

18. A renewable power system for an inline device in a pipeline wherein the inline device includes at least one inspection tool, comprising:
- a thermoelectric generator in the inline device configured to convert thermal energy generated by a transmission medium in the pipeline to electricity;
- a pressure generator in the inline device configured to convert pressure energy generated by the transmission medium in the pipeline to electricity, wherein the pressure generator includes a plurality of blades configured to rotate in response to flow of the transmission medium in the pipeline; and
- an auxiliary system that receives a power supply from at least one of the thermoelectric generator and/or the pressure generator and powers the at least one inspection tool in the inline device.

19. The renewable power system of claim 18, wherein the thermoelectric generator comprises:
- a hot surface and a cold surface;
- one or more heat transfer support structures for transferring the thermal energy generated by the transmission medium in the pipeline to the hot surface; and
- a plurality of thermoelectric modules between the hot surface and the cold surface, wherein the plurality of thermoelectric modules generate electricity using a thermal gradient formed between the hot surface and the cold surface.

20. The renewable power system of claim 18, wherein the pressure generator comprises:
- a turbine including the plurality of blades, wherein the plurality of blades are configured to rotate in response to flow of the transmission medium and generate mechanical energy;
- an alternator for generating electrical energy from the mechanical energy; and
- a connection axis connecting the turbine and the alternator.

* * * * *